United States Patent [19]

Tadachi et al.

[11] Patent Number: 4,673,895
[45] Date of Patent: Jun. 16, 1987

[54] OSCILLATOR HAVING IMPROVED COUPLING BETWEEN STRIPLINE AND DIELECTRIC RESONATOR

[75] Inventors: Akio Tadachi; Akira Takayama, both of Soma, Japan

[73] Assignee: Alps Electric Co., Ltd., Japan

[21] Appl. No.: 900,499

[22] Filed: Aug. 26, 1986

[30] Foreign Application Priority Data

Aug. 26, 1985 [JP] Japan .................... 60-129635[U]

[51] Int. Cl.⁴ .............................................. H03B 5/18
[52] U.S. Cl. ................................ 331/99; 331/117 FE; 331/117 D; 333/219; 333/227
[58] Field of Search ............. 331/96, 107 SL, 117 D, 331/117 R, 117 FE, 99; 333/219, 220, 221, 227, 231, 232, 238, 246, 247

[56] References Cited

U.S. PATENT DOCUMENTS 4,307,352 12/1981 Shinkawa et al. ......... 331/117 D X
4,331,940 5/1982 Uwano .......................... 331/99
4,357,582 11/1982 Ishihara et al. ................ 331/96

FOREIGN PATENT DOCUMENTS 57-145411 9/1982 Japan .................. 331/107 SL

Primary Examiner—Siegfried H. Grimm
Attorney, Agent, or Firm—Guy W. Shoup

[57] ABSTRACT

An oscillator with a dielectric resonator capable of providing a designated output and being suited for mass production comprising an insulating substrate, a strip structure, a dielectric resonator located adjacent to the strip structure, the last two being mounted on the substrate, and an oscillatory transistor connected to one end of the strip structure. The strip structure consists of two spaced strip sections interconnected by an electrically-conductive bridge-shaped connector section having a conductor part, which is located further away from the insulating substrate and closer to the dielectric resonator than the two strip sections.

1 Claim, 4 Drawing Figures

OSCILLATOR HAVING IMPROVED COUPLING BETWEEN STRIPLINE AND DIELECTRIC RESONATOR

BACKGROUND OF THE INVENTION

Field of the Invention

This invention relates to an oscillator with a dielectric resonator (referred to as resonator-utilized oscillator hereinafter), the coupling between both being high and simply-adjustable, and which is capable of providing a definite oscillation output.

DESCRIPTION OF THE PRIOR ART

Figure 3:
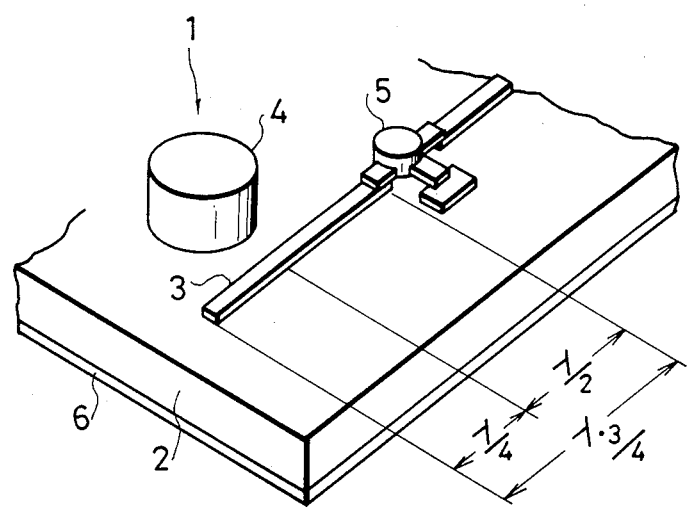
FIG. 3 is a fragmentary perspective view of a prior art oscillator with a dielectric resonator.
Figure 4:
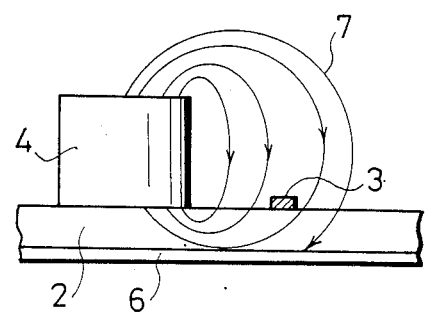
FIG. 4 is a fragmentary cross-sectional view of the oscillator of FIG. 3.

Referring FIGS. 3 and 4 which illustrate a prior art resonator-utilized oscillator 1, which consists of an alumina substrate 2 with a strip line 3 formed thereon and, a dielectric resonator 4 located adjacent to the strip line 3 and likewise mounted on the substrate 2, for example, by adhesion. One end of the strip line 3 is connected to a oscillatory transister 5. The alumina substrate 2 has an elctrode 6 overlaid on the back. (The electrode 6 is referred to as back electrode hereinafter). The strip line 3 has a length correspondent to $3\lambda/4$ from the resonation frequency of the dielectric resonator 4 and is connected at one end to an oscillatory transister 5. The dielectric resonator 4 also is located $\lambda/2$ distant from the oscillatory transistor 5 so that the magnetic flux 7 generated from the dielectric resonator 4 is coupled at a maximum degree with the strip line 3. The distance from the dielectric resonator to the strip line 3 can suitably be adjustable taking into consideration the conditions such as the selectivity Q of the dielectric resonator 4 and the thickness of the alumina substrate 2.

The above-mentioned conventional resonator-utilized oscillator 1, as understood from FIG. 4, because of the narrow spacing between the strip line 3 and the back electrode 6, the magnetic flux 7 is little intercrossed with the strip line 3, that is, at a low coupling. It therefore is required for increasing the coupling to locate the dielectric resonator 4 extremely close to the strip line 3. Owing to the mounting the dielectric resonator 4 just on the alumina substrate 2, for example, by adhesion, however it is difficult to locate the dielectric resonator 4 at a high precision. This contributes to variance in the coupling of the product. In particular the closer to the strip line 3 the dielectric resonator 4 is located, the higher the variance in the coupling becomes. Thus the oscillation output of the resonator-utilized oscillator 1 varies from product to product, and for this reason, is unsuitable for mass production, together with the problem of being incapable of adjusting the coupling.

It therefore is an object of the invention to solve the problems encountered in the prior art and to provide a resonator-utilized oscillator having a higher and simply-adjustable coupling.

The object has been achieved by the construction of a resonator-utilized oscillator according to the invention comprising an insulating substrate, an strip structure, a dielectric resonator located adjacent to the strip structure, the last two being mounted on the substrate, and an oscillatory transistor connected to one end of the strip structure, the strip structure consisting of two spaced strip sections and an electrically-conductive bridge-shaped connector section having a conductor part, which is located further away from the insulating substrate and closer to the dielectric resonator than the two strip-sections and which is connected between the two strip sections.

The above-mentioned strip structure cosisting of two spaced strip sections and an electrically-conductive bridge-shaped connector section connected between the two strip sections and located further away from the insulating substrate and closer to the dielectic resonator, therefore with more spacing between the conductive connector section and the back electrode, contributes, in virtue of the denser intercross between the magnetic flux generated by the dielectric resonator and the conductor part, to improvement in the coupling. Besides this construction permits simple adjustment of the coupling by changing the position of the bridge-shaped conductive connector section to be further away from or nearer towards the dielectric resonator.

DESCRIPTION OF THE PREFERRED EMBODIMENT OF THE INVENTION

Figure 1:
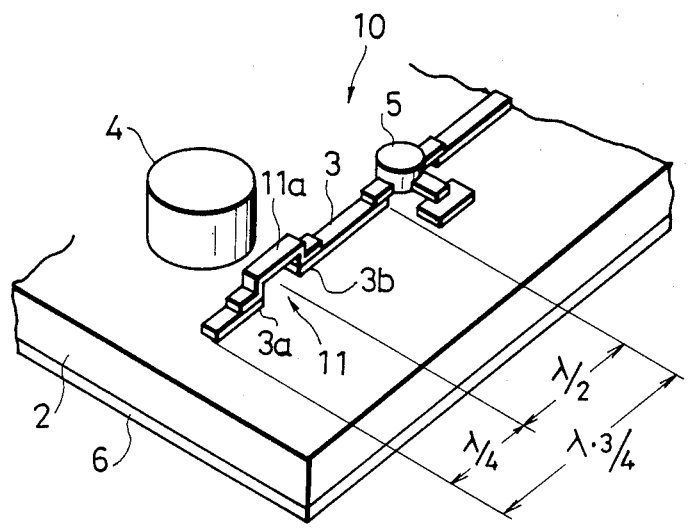
FIG. 1 is a fragmentary perspective view of an example of an oscillator with a dielectric resonator embodying the invention.
Figure 2:
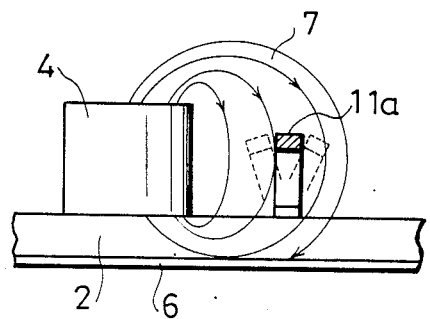
FIG. 2 is a fragmentary cross-sectional view of the same.

Referring to FIGS. 1 and 2, which are frangmentary perspective and cross-sectional views, respectively, of an example of a resonator-utilized oscillator embodying the invention, corresponding parts to those in FIGS. 3 and 4 are designated by the same reference characters, thus with omission of description of them, The feature of the resonator-utilized oscillator 10 according to the invention resides in that instead of the strip line 3 having a length of $3\lambda/4$ in FIGS. 3 and 4, a strip structure is used consisting of two spaced sections of $\lambda/2$ and $\lambda/4$, respectively, connected together by a bridge-shaped electrically-conductive connector section 11 located closer to the dielectric resonator 4. The electrically-conductive connector section 11 is an inverted U-shaped sectional metallic structure including a conductor part 11a further away from the alumina substrate 2.

In the above-mentioned construction, as shown in FIG. 2, the conductor part 11a is further away from the back electrode 6, and as the result, exposed at a higher density to the magnetic flux 7 generated from the dielectric resonator 4 with consequent improved coupling. As indicated by solid and broken lines, the conductive connector 11 may be bent nearer toward or further away from the dielectric resonator 4 so that the coupling can be simply adjusted. This adjustment enables the oscillatory transistor 5 to receive input of a certain level resonance frequency and provide a definite level oscillation output, and thus the oscillator is suited for mass production.

Instead of the bridge-shaped electrically-conductive connector section 11 in the above-described embodiment, any shaped structure having a conductor part further away from the surface of the alumina substrate 2 and located to be densely coupled with the dielectric resonator 4 can be used. It goes without saying that the insulating substrate may instead of alumina be made from any other useful material.

The above-mentioned strip structure consisting of two spaced strip sections and an electrically-conductive bridge-shaped connector section connected between the two strip sections and located further away from the insulating substrate and closer to the dielectric resonator, therefore with more spacing between the conductive connector section and the back electrode, contributes, in virtue of the denser intercross between the magnetic flux generated by the dielectric resonator and the conductor part, to improvement in the coupling. Besides this construction permits simple adjustment of the coupling by changing the position of the bridge-shaped conductive connector section to be further away from or nearer towards the dielectric resonator. Thus it has advatages of providing a designated output and being suited for mass production.

What is claimed is:

1. An oscillator comprising an insulating substrate, a strip structure, a dielectric resonator located adjacent to the strip structure, the last two being mounted on the substrate, and an oscillatory transistor connected to one end of said strip structure, said strip structure consisting of two spaced strip sections and an electrically-conductive bridge-shaped connector section having a conductor part, said conductor part being located further away from said insulating substrate and closer to said dielectric resonator than said two strip sections and being connected between said two strip sections.

* * * * *